US005477808A

United States Patent [19]
Oelkrug et al.

[11] Patent Number: 5,477,808
[45] Date of Patent: Dec. 26, 1995

[54] PROCESS FOR REDUCING THE OXYGEN INCORPORATION INTO A SINGLE CRYSTAL OF SILICON

[75] Inventors: Hans Oelkrug, Haiming; Franz Segieth, Kirchham, both of Germany

[73] Assignee: Wacker-Chemitronic Gesellschaft fuer Elektronik-grundstoffe mbH, Munich, Germany

[21] Appl. No.: 203,220

[22] Filed: Feb. 28, 1994

[30] Foreign Application Priority Data

Mar. 25, 1993 [DE] Germany ............................ 43 09 769.3

[51] Int. Cl.[6] .................................................... C30B 15/20
[52] U.S. Cl. ................................................ 117/20; 117/920
[58] Field of Search .................................. 117/20, 25, 31, 117/210, 213, 217, 218, 920, 932

[56] References Cited

U.S. PATENT DOCUMENTS

| | | | |
|---|---|---|---|
| 4,497,777 | 5/1985 | Kojima | 117/932 |
| 4,545,849 | 10/1985 | d'Aragona | 156/617.1 |
| 4,944,834 | 7/1990 | Tada et al. | 117/213 |
| 5,131,974 | 7/1992 | Oda et al. | 117/20 |
| 5,270,020 | 12/1993 | Suzuki et al. | 117/31 |

OTHER PUBLICATIONS

"Silicon Processing For The VLSI Era; Wolf et al., vol. I: Process Technology; Chapter 2" Crystalline Defects, Thermal Processing and Gettering; (1986); pp. 66–70.

Semiconductor International; Butler; "Controlling Oxygen In Silicon: Key to Higher VLSI Circuit Yields".

*Primary Examiner*—R. Bruce Breneman
*Assistant Examiner*—Felisa Garrett
*Attorney, Agent, or Firm*—Collard & Roe

[57] ABSTRACT

A process and an apparatus reduces the oxygen incorporation into a single crystal of silicon which is drawn by the Czochralski method. If a molding is immersed at least temporarily in the melt between the single crystal and the crucible wall during drawing of the single crystal, the oxygen content of the single crystal is reduced compared with the oxygen content of a single crystal which has been drawn without the use of the molding.

2 Claims, No Drawings

PROCESS FOR REDUCING THE OXYGEN INCORPORATION INTO A SINGLE CRYSTAL OF SILICON

BACKGROUND OF THE INVENTION

1. Field of the Invention

The present invention relates to a process for reducing the oxygen incorporation into a single crystal of silicon, the single crystal being drawn from a melt which is present in a quartz-lined crucible. The invention furthermore relates to an apparatus for carrying out the process.

2. The Prior Art

This method of growing single crystals is known as the Czochralski method. The content of oxygen in single crystals of silicon which have been produced by the Czochralski method has substantial effects on the subsequent use of the single crystal as a basic material for the production of electronic components. Doping the crystal lattice with oxygen causes problems in the region of the thin wafers which is close to the surface, the single crystal initially being divided into said wafers. The electronic structures are integrated in this region, and every impurity not deliberately introduced there may subsequently adversely affect the satisfactory functioning of a component or even lead to the failure of entire circuits. It is therefore ensured, for example, by thermal treatment of the wafer, that oxygen incorporated in the crystal diffuses out of the region close to the surface, resulting in the formation of a zone which has a low oxygen content and typically extends to a depth of 10 µm into the interior of the wafer. In the wafer region below this, which acts only as a substrate for the components, the oxygen incorporated in the crystal forms, in the course of treatment of the wafer, precipitates which, as nucleating centers, also attract and bind the metallic impurities which particularly interfere with the functioning of the components from all regions of the wafer. For this purpose, referred to as "intrinsic gettering", incorporation of oxygen during drawing of the single crystal is entirely desirable. The disadvantage of the Czochralski method is that the incorporation of oxygen during drawing of the single crystal does not take place at a constant rate, so that different oxygen concentrations are measured along the longitudinal axis of the single crystal, which is as a rule rod-like. At the beginning of the crystal growth, when the inner wall of the crucible is substantially covered by the melt, the incorporation of oxygen into the single crystal is the greatest. The concentration of oxygen in the single crystal decreases toward the end of the rod.

According to U.S. Pat. No. 4,545,849, the oxygen incorporation into the single crystal can be increased and the axial distribution of the oxygen in the single crystal can be rendered uniform by means of a toroidal body of silica which is present on the bottom of the crucible during drawing of the crystal. The disadvantage of this is that the wafers produced from such a single crystal require relatively long annealing times for the production of that region close to the surface which has a low oxygen content. The producers of electronic components are therefore increasingly also demanding silicon wafers having lower oxygen concentrations, especially since removal of impurities from those wafer regions close to the surface in which the electronic structures are integrated is possible not only by "intrinsic gettering", but also by a treatment of the back of the wafer which is referred to as "backside damage." However, only single crystals having particularly high oxygen concentrations can be drawn by the process described in U.S. Pat. No. 4,545,849. The rod-like single crystals which are produced by the usual Czochralski method have, particularly at the beginning of the rod, oxygen concentrations which are so high that the wafers produced therefrom often no longer meet the customers' requirements.

SUMMARY OF THE INVENTION

It is therefore an object of the present invention to provide a process which makes it possible to overcome the stated disadvantages and which provides single crystals having a uniform axial oxygen concentration, the oxygen incorporation being reduced compared with the conventional Czochralski method. It is a further object to provide an apparatus for carrying out the process.

This object is achieved according to the invention by a process for reducing the oxygen incorporation into a single crystal of silicon, the single crystal being drawn from a melt which is present in a quartz-lined crucible, wherein a molding is immersed at least temporarily in the melt between the single crystal and the inner wall of the crucible during drawing of the single crystal.

This object is furthermore achieved by an apparatus according to the invention which has a molding which is immersed at least temporarily into the melt between the single crystal and the inner wall of the crucible during drawing of the single crystal.

It has surprisingly been found that it is possible to reduce the oxygen incorporation into the growing single crystal if the convection currents prevailing in the melt during drawing of the single crystal are disturbed by the immersion of a molding in the melt. It has furthermore been found that the melt is homogenized by the immersed molding, the resulting single crystals have fewer crystal defects, and the yields of material which can be utilized for electronic purposes are increased.

The molding may in principle be any material which is not attacked by molten silicon and which does not release any impurities into the melt. The molding preferably comprises quartz or at least has a surface coating of quartz. Although it is to be expected, in the case of a quartz molding, that the quartz will slowly dissolve on contact with the melt, the action of the molding in reducing the incorporation of oxygen into the single crystal is unaffected by this.

Of course, the molding must be sufficiently stable to prevent parts thereof from breaking off during the drawing of the single crystal and disturbing the dislocation-free crystal growth. Furthermore, there are no particular limitations with regard to the molding geometry to be chosen. Rectangular or circular sheet-like moldings and parallelepipedal, cubic, cylindrical or spherical moldings have proven useful.

What is important for the action of the molding in reducing the oxygen incorporation into the single crystal is that the molding and the melt move relative to one another. Since, as a rule, the single crystal and the crucible containing the melt are rotated during drawing of the single crystal, it is sufficient in this case to immerse the molding in the melt and keep it stationary. In principle, however, it is also possible to move the molding immersed in the melt to and fro with a small amplitude or to move it in a concentric path around the single crystal.

The molding is immersed in the melt at a point between the single crystal and the inner wall of the crucible, preferably 15 to 35 mm from the three-phase boundary of the melt, single crystal and gas space. The depth of immersion is at least 5 mm, preferably 10 to 20 mm.

In an embodiment of the process, the molding is brought into its intended position during drawing of the single crystal before drawing of the single crystal begins. The crucible filled with molten silicon is then raised from a position below the molding until the molding is immersed in the melt and has reached the intended depth of immersion. Only then is the actual drawing of the single crystal initiated by first bringing a monocrystalline seed crystal into contact with the melt via a drawing apparatus and then drawing it out in a controlled manner in a vertical direction relative to the melt.

In another embodiment, the molding is initially present above the melt surface and is then lowered until it is immersed in the melt in the intended manner to the intended depth of immersion. This may be effected before or after the seed crystal has been brought into contact with the melt.

Although in the preferred embodiment the molding is immersed continuously in the melt during the drawing of the single crystal and it is accordingly ensured that the depth of immersion of the molding remains constant as the melt level falls, this is not absolutely essential. The molding may also be immersed in the melt only temporarily, for example only during the initial phase of the drawing process, during which the rate of incorporation of oxygen into the single crystal is particularly high. In this way, it is possible to produce single crystals whose axial oxygen concentration is particularly uniform.

The preferred embodiment of an apparatus for carrying out the process comprises, in addition to the typical features of a unit for drawing single crystals by the Czochralski method, such as a heatable crucible provided with a quartz inner wall for holding the melt, a drawing apparatus which makes it possible to draw out the seed crystal brought into contact with the melt surface. The preferred embodiment further comprises an apparatus for raising, lowering and rotating the crucible, also the molding immersed in the melt at least temporarily during drawing of the single crystal. Such embodiment also comprises an apparatus by means of which this molding can be brought into, and kept in, the predetermined position between the single crystal and the inner wall of the crucible.

In a particularly preferred embodiment, the molding is in the form of a rectangular, sheet-like quartz structure which is immersed in the melt and kept stationary, preferably in such a way that the molding offers as high a flow resistance as possible to the movement of the melt caused by rotation of the crucible.

The apparatus by means of which the molding is brought into, and kept in, the predetermined position between the single crystal and the inner wall of the crucible preferably consists of a lance which carries the molding and is composed of graphite or of another material which does not contaminate the single crystal. The free end of the lance is fastened to a suitable point of the drawing unit, for example to the recipient wall, the shielding of the crucible heater or the pot-like crucible cover frequently encountered in drawing units.

Other objects and features of the present invention will become apparent from the following detailed description considered in connection with the accompanying Examples, which disclose the embodiments of the present invention. It should be understood, however, that the Examples are designed for the purpose of illustration only and not as a definition of the limits of the invention.

DETAILED DESCRIPTION OF PREFERRED EMBODIMENTS

EXAMPLE 1

(Invention)

A rod-like single crystal having a length of 710 mm and a diameter of 205 mm was drawn in a unit which is customarily used for drawing silicon single crystals by the Czochralski method and was additionally equipped, as described above, with a rectangular sheet-like structure as a molding. During the drawing of the single crystal, the molding was immersed in the melt as described above to a depth of 12 mm and was kept stationary.

EXAMPLE 2

(Comparative)

In a second experiment, a comparative crystal was drawn under otherwise identical conditions to those described above for Example 1, but without the molding. The incorporation of oxygen into the single crystals was then measured as a function of the axial position in the rod-like crystal. For this purpose, the single crystals were cut into thin wafers, the position of a wafer in the rod was documented, and the oxygen concentration in the center of the wafer was determined by infrared measurements. The result of the measurements is shown in the Table below:

TABLE

| Position on crystal [mm from shoulder] | Procedure/ [with/without molding] | Oxygen concentration [$10^{17}$ cm$^{-3}$] |
|---|---|---|
| 30 | with | 7.51 |
| 260 | with | 7.17 |
| 490 | with | 6.58 |
| 700 | with | 6.84 |
| 30 | without | 8.12 |
| 250 | without | 7.85 |
| 470 | without | 7.67 |
| 710 | without | 7.48 |

While several embodiments of the present invention have been shown and described, it is to be understood that many changes and modifications may be made thereunto without departing from the spirit and scope of the invention as defined in the appended claims.

What is claimed is:

1. A process for reducing the oxygen incorporation into a single crystal of silicon, said single crystal being drawn from a melt, which is present in a quartz-lined crucible, comprising immersing a molding in the melt between the single crystal and an inner wall of the crucible and keeping the molding stationary during drawing of the single crystal; and moving the molding and the melt relative to one another, while the molding offers a high resistance to the melt.

2. The process as claimed in claim 1, wherein the depth of immersion is 10–20 mm.

* * * * *